(12) United States Patent
Takase et al.

(10) Patent No.: US 9,238,357 B2
(45) Date of Patent: Jan. 19, 2016

(54) SUPPORTING MEMBER SEPARATION APPARATUS AND SUPPORTING MEMBER SEPARATION METHOD

(71) Applicant: Tokyo Ohka Kogyo Co., Ltd., Kawasaki-shi (JP)

(72) Inventors: Shinji Takase, Kawasaki (JP); Yoshihiro Inao, Kawasaki (JP); Akihiko Nakamura, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 59 days.

(21) Appl. No.: 14/202,445

(22) Filed: Mar. 10, 2014

(65) Prior Publication Data
US 2014/0318714 A1    Oct. 30, 2014

(30) Foreign Application Priority Data
Apr. 30, 2013    (JP) .................. 2013-095969

(51) Int. Cl.
*B32B 38/10*    (2006.01)
*B32B 43/00*    (2006.01)
*H01L 21/67*    (2006.01)

(52) U.S. Cl.
CPC ........ *B32B 43/006* (2013.01); *H01L 21/67092* (2013.01); *B32B 2457/14* (2013.01); *H01L 2221/68386* (2013.01); *Y10T 156/1132* (2015.01); *Y10T 156/1168* (2015.01); *Y10T 156/1195* (2015.01); *Y10T 156/1944* (2015.01); *Y10T 156/1978* (2015.01); *Y10T 156/1994* (2015.01)

(58) Field of Classification Search
CPC ................... B32B 43/006; H01L 2221/68381; H01L 2221/68386; Y10T 156/1132; Y10T 156/1168; Y10T 156/1195; Y10T 156/1944; Y10T 156/1978; Y10T 156/1994
See application file for complete search history.

(56) References Cited

U.S. PATENT DOCUMENTS

| | | | |
|---|---|---|---|
| 7,187,162 B2 * | 3/2007 | Kerdiles et al. | 324/756.07 |
| 8,360,129 B2 * | 1/2013 | Ebata et al. | 156/764 |
| 8,828,186 B2 * | 9/2014 | Konno et al. | 156/707 |
| 8,858,756 B2 * | 10/2014 | Lee | 156/705 |
| 8,946,344 B2 * | 2/2015 | Kudo et al. | 524/507 |
| 2010/0000680 A1 | 1/2010 | Inao et al. | |
| 2014/0332166 A1 * | 11/2014 | Honda et al. | 156/708 |

FOREIGN PATENT DOCUMENTS

| | | |
|---|---|---|
| JP | 2010-16125 A | 1/2010 |
| WO | WO 2013/005589 A1 | 1/2013 |

* cited by examiner

*Primary Examiner* — Mark A Osele
(74) *Attorney, Agent, or Firm* — Knobbe Martens Olson & Bear LLP

(57) ABSTRACT

A supporting member separation apparatus that separates a supporting member from a laminate having a substrate, an adhesive layer, a release layer which has a property that changes when it absorbs light, and the supporting member which are laminated in this order. The apparatus includes a holding unit that holds one surface of the laminate, a lifting and lowering unit that lifts and lowers the holding unit, and an adjustment unit that maintains a constant applied force to the holding unit.

10 Claims, 1 Drawing Sheet

(a)
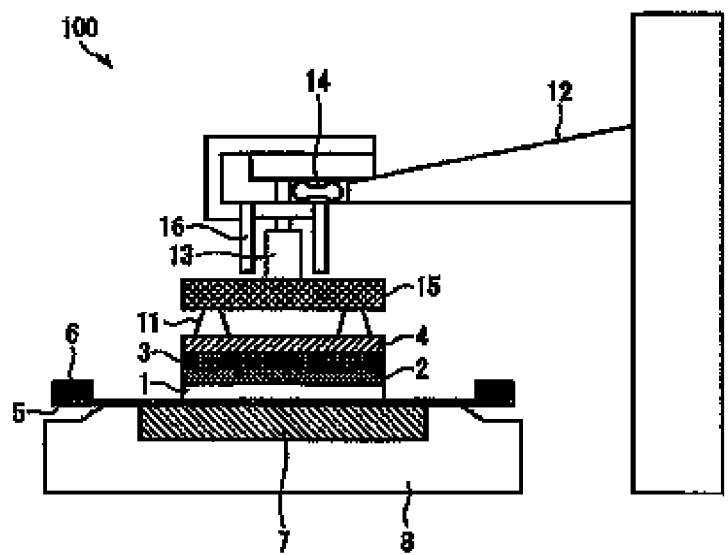
(b)
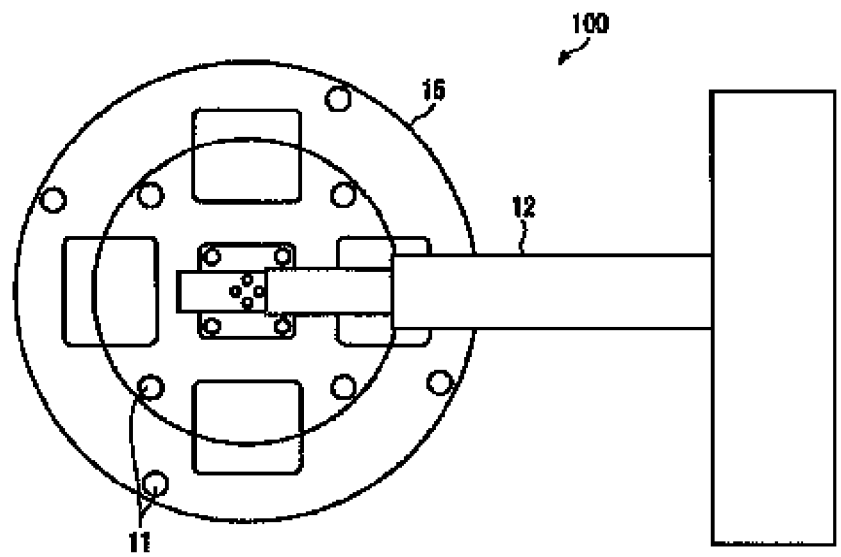

SUPPORTING MEMBER SEPARATION APPARATUS AND SUPPORTING MEMBER SEPARATION METHOD

CROSS-REFERENCE TO RELATED APPLICATIONS

This application claims priority under 35 U.S.C. §119(a)-(d) to Japanese Patent Application No. 2013-095969, filed Apr. 30, 2013, the entire content of which is incorporated herein by reference.

TECHNICAL FIELD

The present invention relates to a supporting member separation apparatus and a supporting member separation method for separating a supporting member from a laminate.

BACKGROUND ART

In recent years, IC cards and electronic devices such as mobile phones are required to be thin in thickness, compact in size, and light in weight. In order to meet the requirements, semiconductor chips that are incorporated have to be thin in thickness as well. Accordingly, it is said that wafer substrates for next-generation chips have to have a thickness of 25 μm to 50 μm although wafer substrates forming the basis of semiconductor chips currently in use have a thickness (film thickness) of 125 μm to 150 μm. As such, processes for reducing the thickness of the wafer substrates are essential to obtain the wafer substrates having the above-described film thickness.

Because the strength of a wafer substrate is decreased by a thinning process, structures such as a circuit are mounted on the wafer substrate while the wafer substrate is automatically transported in a state where a support plate is adhered thereto during a manufacturing process so as to prevent damage to the thinned wafer substrate. After the manufacturing process, the wafer substrate is separated from the support plate. Accordingly, it is preferable that the wafer substrate and the support plate be firmly adhered to each other during the manufacturing process. However, after the manufacturing process, it is preferable that the wafer substrate be smoothly separated from the support plate.

In a case where the wafer substrate and the support plate are firmly adhered to each other, it is difficult to separate the support plate from the wafer substrate without causing damage to the structures mounted on the wafer substrate depending on adhesive materials. Accordingly, the development of a temporary fixing technology, which is extremely difficult, is required for firm adhesion between the wafer substrate and the support plate during the manufacturing process and separation of the elements mounted on the wafer substrate without damage to the elements after the manufacturing process.

As an example of the temporary fixing technology, a release layer which has a property that changes when irradiated with light may be disposed in advance between an adhesive layer that adheres the wafer substrate and the support plate with each other and the support plate. After the property of the release layer is changed (altered) by irradiating the release layer with light, a force is added to the laminate where the wafer substrate and the support plate are adhered so that the separation between the support plate and the wafer substrate can be performed.

Herein, Patent Literature 1 discloses a peeling apparatus that includes adsorption means where a support plate is adsorbed and peels off the support plate from a substrate to which the support plate is adhered.

Also, Patent Literature 2 discloses a glass substrate peeling apparatus that includes peeling means which peels off a glass substrate adsorbed and held by an adsorption sheet with a liquid being interposed from the adsorption sheet.

CITATION LIST

Patent Literature

Patent Literature 1
JP-A-2010-16125 (Publication Date: Jan. 21, 2010)
Patent Literature 2
Pamphlet of International Publication No. 2013-5589 (Publication Date: Jan. 10, 2013)

SUMMARY OF INVENTION

Technical Problem

However, when the separation between the supporting member and the substrate that are adhered via the adhesive layer is performed, the altered release layer has different degrees of alteration in areas. As such, the supporting member cannot be separated appropriately by just vertically raising the supporting member, and damage to or a deformation of the substrate may be caused.

A supporting member separation apparatus and a supporting member separation method according to the invention are to address the above-described disadvantage, and an object thereof is to separate a supporting member from a laminate with a relatively small force and while suppressing damage to or a deformation of a substrate.

Solution to Problem

According to an aspect of the invention, there is provided a supporting member separation apparatus that separates a supporting member from a laminate having a substrate, an adhesive layer, a release layer which has a property that changes by absorbing light, and the supporting member which are laminated in this order, the supporting member separation apparatus including a holding unit that holds one surface of the laminate, a lifting and lowering unit that lifts and lowers the holding unit, and an adjustment unit that maintains a force which is applied to the holding unit to be constant.

According to another aspect of the invention, there is provided a supporting member separation method for separating a supporting member from a laminate having a substrate, an adhesive layer, a release layer which has a property that changes by absorbing light, and the supporting member which are laminated in this order, and the method includes fixing the laminate, holding one surface of the laminate while being adjusted so that an applied force is maintained to be constant, and lifting and lowering the laminate.

Advantageous Effects of Invention

With the supporting member separation apparatus and the supporting member separation method according to the invention, the supporting member can be separated from the laminate with a relatively small force and while suppressing damage to or a deformation of a substrate.

BRIEF DESCRIPTION OF THE DRAWINGS

FIGS. 1A and 1B are schematic configuration views showing a supporting member separation apparatus according to an embodiment of the invention. FIG. 1A is a side view and FIG. 1B is a top view.

DETAILED DESCRIPTION OF THE PREFERRED EMBODIMENTS

Hereinafter, an embodiment of the invention will be described with reference to FIGS. 1A and 1B. FIGS. 1A and 1B are schematic configuration views showing a supporting member separation apparatus 100 according to the embodiment of the invention. FIG. 1A is a side view and FIG. 1B is a top view.

Supporting Member Separation Apparatus 100

As shown in FIG. 1A, the supporting member separation apparatus 100 according to this embodiment includes a porous portion 7, a stage 8, holding units 11, a lifting and lowering unit 12, an adjustment unit 13, a detection unit 14, a plate portion 15, and a stopper 16.

The supporting member separation apparatus 100 is an apparatus that separates a support plate 4 from a laminate having a substrate 1, an adhesive layer 2, a release layer 3 which has a property that changes by absorbing light, and the support plate (supporting member) 4 which are laminated in this order. Also, the supporting member separation apparatus 100 may further include light irradiation means that irradiates the release layer 3 with light, and the support plate 4 may be separated from the laminate after the property of the release layer 3 is changed in a state of being mounted on the supporting member separation apparatus 100, or the laminate may be transported to the supporting member separation apparatus 100 and the support plate 4 may be separated from the laminate after the property of the release layer 3 is changed out of the supporting member separation apparatus 100.

Substrate 1

The substrate 1 is adhered to the support plate 4 via the adhesive layer 2. Then, the substrate 1 can be subjected to a process such as thinning and mounting in a state of being supported by the support plate 4. The substrate 1 is not limited to a silicon wafer substrate, but any substrate such as a ceramics substrate, a thin film substrate, and a flexible substrate can be used as the substrate 1.

Support Plate 4

The support plate (supporting member) 4 is a supporting member that supports the substrate 1, and is adhered to the substrate 1 via the adhesive layer 2. As such, the support plate 4 may have strength required to prevent damage to or a deformation of the substrate 1 during the thinning, transport, or mounting process or the like for the substrate 1. From this point of view, examples of the support plate 4 include those formed of glass, silicon, an acrylic resin, or the like.

Adhesive layer 2

The adhesive layer 2 adheres the substrate 1 and the support plate 4 with each other, and is formed by applying an adhesive to the substrate 1. A method for applying the adhesive to the substrate 1 or the support plate 4 is not particularly limited, and examples thereof include spin coating, dipping, rollerblading, spray coating, and slit coating. In this embodiment, the adhesive layer is formed on the substrate, but the adhesive layer may be formed on the supporting member without being limited thereto.

The adhesive that is used to form the adhesive layer 2 is not particularly limited but, preferably, is a thermoplastic adhesive material whose thermal fluidity is improved by heating. Examples of the thermoplastic adhesive material include an acrylic resin, a styrene-based resin, a maleimide-based resin, a hydrocarbon-based resin, and an elastomer.

The thickness of the adhesive layer 2 can be appropriately set according to the types of the substrate 1 and the support plate 4 that are targets of the adhesion, processing performed on the substrate 1 after the adhesion, and the like. Preferably, the thickness is 5 μm to 300 μm. More preferably, the thickness is 10 μm to 200 μm.

Release layer 3

The release layer 3 is a layer that changes its property when irradiated with light. The release layer 3 is formed between the substrate 1 and the support plate 4. Accordingly, the substrate 1 and the support plate 4 can be easily separated from each other by irradiating the release layer 3 with light after the thinning, transport, or mounting process or the like for the substrate 1.

In this specification, the "property change" of the release layer 3 means a phenomenon in which the release layer 3 is put to a state where the release layer 3 can be destructed in response to a slight external force or a state where an adhesive force between the release layer 3 and a layer in contact therewith is reduced. Also, the property change of the release layer 3 can be (pyrogenic or non-pyrogenic) decomposition, cross-linking, a conformational change, dissociation of a functional group (and curing, degassing, contraction, or expansion of the release layer 3 caused thereby) by energy of the absorbed light, or the like.

Also, an inorganic film or an organic film that is formed by the plasma CVD method may be used as the release layer 3. A metal film or the like can be used as the inorganic film, and a fluorocarbon film can be used as the organic film. Such reaction films can be formed by the plasma CVD method on the support plate 4.

As the light with which the release layer 3 is irradiated, solid-state laser such as YAG laser, ruby laser, glass laser, $YVO_4$ laser, LD laser, and fiber laser, liquid laser such as dye laser, gas laser such as $CO_2$ laser, eximer laser, Ar laser, and He—Ne laser, laser light such as semiconductor laser and free electron laser, or non-laser light may be used appropriately according to a wavelength which can be absorbed by the release layer 3. The wavelength of the light to be absorbed by the release layer 3 is not limited thereto but, for example, can be the light having a wavelength of 600 nm or less.

The release layer 3 may contain a light absorbing agent that is decomposed by light or the like. Examples of the light absorbing agent that can be used include fine metal powder such as graphite powder, iron, aluminum, copper, nickel, cobalt, manganese, chromium, zinc, and tellurium, metal oxide powder such as black titanium oxide, carbon black, or an aromatic diamine-based metal complex, an aliphatic diamine-based metal complex, an aromatic dithiol-based metal complex, a mercaptophenol-based metal complex, a squarylium-based compound, and a dye or a pigment such as a cyanine-based dye, a methane-based dye, a naphthoquinone-based dye, and an anthraquinone-based dye. The release layer 3 can be formed when mixed with, for example, a binder resin and applied onto the support plate 4. Also, a resin having a light-absorbing group can be used as the release layer 3.

Dicing Tape 5

The dicing tape 5 is adhered to one surface of the substrate 1 so as to reinforce the strength of the substrate 1. In this embodiment, the substrate 1 of the laminate is adhered to the dicing tape 5 where a dicing frame 6 is mounted on an outer circumference thereof.

A dicing tape that has a configuration in which an adhesive layer is formed on a base film or the like can be used as the dicing tape 5. Examples of the base film that can be used include a resin film of polyvinyl chloride (PVC), polyolefin, or polypropylene. The outer diameter of the dicing tape 5 is larger than the outer diameter of the substrate 1. When the substrate 1 and the dicing tape 5 are adhered with each other, apart of the dicing tape 5 is in a state of being exposed to an outer edge part of the substrate 1.

The dicing frame 6 that prevents bending of the dicing tape 5 is mounted on a further outer circumference than the exposed surface of the dicing tape 5. In other words, the dicing frame 6 is in a state of exposure in the outer edge part of the dicing tape 5. Examples of the dicing frame 6 include a dicing frame formed of a metal such as aluminum, a dicing frame formed of an alloy such as stainless steel (SUS), and a dicing frame formed of a resin. Examples of the dicing frame formed of a resin include a dicing frame formed of a resin manufactured by Shin-Etsu Polymer Co., Ltd. or manufactured by DISCO Corporation.

When the dicing frame formed of a metal or an alloy is used as the dicing frame 6, the dicing frame 6 has rigidity, is unlikely to be distorted, and is low in price, but is heavier in weight than the dicing frame formed of a resin and thus poses burden on an operator or a transfer robot during transport. In recent years, flat and rigid dicing frames formed of resins have been developed with an advantage of being lighter in weight than the dicing frames formed of metals and alloys which were in wide use. The dicing frames formed of resins are lighter in weight and thus facilitate transport and, moreover, has an advantage of generating little dust due to friction caused when put in and taken out of a frame cassette formed of a metal.

Hereinafter, each configuration of the supporting member separation apparatus 100 will be described.

Porous Portion 7

The porous portion 7 is a porous part that is disposed on the stage 8. The laminate to which the dicing tape 5 is adhered is mounted on the stage 8 in such a manner that the laminate is positioned on the porous portion 7. In this manner, the laminate to which the dicing tape 5 is adhered can be suctioned via the porous portion 7, and the laminate can be fixed properly on the stage 8. Rising of the laminate can be prevented even in a case where the holding unit 11 that holds the support plate 4 is raised by the lifting and lowering unit 12 since the laminate is fixed on the stage 8 via the porous portion 7. Accordingly, the support plate 4 can be separated from the laminate that is fixed on the stage by lifting and lowering the holding unit 11 which holds the support plate 4.

Holding Unit 11

The holding unit 11 is an adsorption pad that holds one surface of the laminate. In this embodiment, the holding unit 11 holds the surface of the support plate 4 of the laminate on the side opposite to the surface where the release layer 3 is disposed. The holding unit 11 has opening portions at both ends and a hollow portion therein. One of the opening portions is in contact with the support plate 4, and the other opening portion is connected to suction means (not shown). Accordingly, the support plate 4 is suctioned and held by the holding unit 11 during suction by the suction means. The holding unit 11 is not limited to suctioning and holding the support plate 4 as in this embodiment but, for example, may be configured to grip and hold the support plate 4.

As shown in FIG. 1B, the holding units 11 are disposed in the circular plate portion 15, and two sets of the four holding units 11 are equidistantly disposed from the center of the plate portion 15. Different holding units 11 are used depending on the size of the support plate 4 which is held. For example, the four holding units 11 on an inner side are used when holding the support plate 4 with a small radius, and the four holding units 11 on an outer side are used when holding the support plate 4 with a large radius. This embodiment shows a case where the four holding units on the outer side are used.

Also, one set of the four holding units 11 that are equidistantly disposed from the center of the plate portion 15 are disposed at a regular interval, and thus the holding units 11 can evenly hold the support plate 4. Also, the holding units 11 that are equidistantly arranged from the center of the plate portion 15 are not limited to four in number, but the number may be any number.

Also, in this embodiment, it is preferable that the center of the holding unit 11 on the outer side (center of the opening portion of the holding unit 11) be in the vicinity of an outer circumference of the plate portion 15. More preferably, the centers of the four holding units 11 on the outer side are positioned on a circumference of a circle formed by a line segment extending from the center of the plate portion 15 and equivalent to at least 80% in length of the radius of the plate portion 15. Even more preferably, the centers of the four holding units 11 on the outer side are positioned on a circumference of a circle formed by a line segment equivalent in length to 90% to approximately 100% of the radius of the plate portion 15. When the centers of the holding units 11 on the outer side are in the vicinity of the outer circumference of the plate portion 15, an equal force is likely to be applied to the entire support plate 4 and the support plate 4 is likely to be separated from the laminate.

Also, in this embodiment, it is preferable that the plate portion 15 and the support plate 4 have almost the same (congruent) shape, and it is more preferable that the radius of the plate portion 15 and the radius of the support plate 4 be almost equal to each other.

In a case where one set of the four holding units 11 are connected to the suction means and are suctioned by the suction means to suction and hold the support plate 4, it is preferable that a combined suction force of the one set of the four holding units 11 be 70 kPa to 100 kPa. More preferably, the combined suction force is 80 kPa to 90 kPa. In this manner, the holding units 11 can properly suction and hold the support plate 4. Also, it is preferable that the suction force of all of the holding units 11 be equal to each other in order for the holding units 11 to evenly hold the support plate 4.

Lifting and Lowering Unit 12

The lifting and lowering unit 12 lifts and lowers the holding units 11. The substrate 1 and the support plate 4 can be separated from each other by lifting and lowering the holding units 11 which hold the support plate 4.

The release layer 3 which has a property that changes when irradiated with light is put to the state where the release layer 3 can be destructed in response to a slight external force or the state where the adhesive force between the release layer 3 and the layer in contact therewith (adhesive layer 2) is reduced. Accordingly, the support plate 4 can be easily separated from the laminate by raising the holding units 11 holding the support plate 4 in a state where the laminate is fixed on the stage 8.

It is preferable that the holding units 11 holding the support plate 4 be raised, in a state where the laminate is fixed on the stage 8, at a speed of 1 mm to 2 mm per second. In this manner, the support plate 4 can be separated gradually, and no excessive force is applied to the substrate 1 or the support plate 4. Also, in a case where the holding units 11 are raised by a total of approximately 20 mm with the support plate 4 being held, the support plate 4 is separated from the laminate inmost cases. Accordingly, no excessive force is applied to the substrate 1 even when the speed at which the holding units 11 are raised is increased after raising the holding units 11 by a total of approximately 20 mm.

Adjustment Unit 13

The adjustment unit 13 is mounted on the plate portion 15, and maintains the force applied to the holding units 11 to be constant. In this manner, the adjustment unit 13 can suppress the application of an excessive force to the laminate held by the holding units 11, and can prevent damage to or a deformation of the substrate 1.

In this embodiment, the adjustment unit 13 has a joint that is movable with respect to the holding units 11. Also, when movable, the joint has an arcuate or circular trajectory that is parallel with or vertical to the surface of the laminate. Since the joint is freely movable with respect to the holding units 11 disposed in the plate portion 15, the force which is applied to the holding units 11 can be maintained to be constant.

In a case where the trajectory of the movable joint is an arc or a circle that is parallel with the surface of the laminate, the holding units 11 and the support plate 4 that are held by the holding units 11 draw an arcuate or circular trajectory which is parallel with the surface of the laminate.

A case where the trajectory of the movable joint is an arc that is vertical to the surface of the laminate refers to a case where a tangent of the arc (also including an extended line of the arc) drawn by the movable joint vertically intersects with the surface of the laminate.

The joint is not particularly limited if movable with respect to the holding units 11, and examples thereof include a floating joint and a universal joint. Since such joints are used as the adjustment unit 13, the holding units 11 are operated along with the support plate 4 in a case where the holding units 11 hold the support plate 4. Accordingly, an equal force is applied to the entire support plate 4 that is held by the holding units 11, and the support plate 4 is separated from the laminate in such a manner that a part of the release layer 3 loosely adhered to the adhesive layer 2 is peeled off first from the adhesive layer 2, a part of the support plate 4 loosely adhered to the release layer 3 is peeled off first from the release layer 3, or a part of the release layer 3 more likely to be destructed is destructed first.

When the holding units 11 hold the support plate 4, the holding units 11 may be inclined in a state where the laminate is fixed to the porous portion 7 of the stage 8. In this manner, the support plate 4 can be inclined with respect to the fixed laminate. When the support plate 4 is inclined, the support plate 4 is likely to be separated from the laminate.

In the supporting member separation apparatus 100 according to this embodiment, a stopper 16 as locking means is disposed so that the holding units 11 are not inclined more than necessary. In this case, when the holding units 11 are to be inclined more than necessary, the stopper 16 is in contact with the adjustment unit 13 or the plate portion 15 and the plate portion 15 is not inclined any more. As such, the application of an excessive force to the substrate 1 or the support plate 4 can be prevented.

Further, in a case where the support plate 4 is inclined with respect to the fixed laminate, it is preferable that the stopper 16 be disposed in such a manner that the difference in height between the highest position of the support plate 4 and the lowest position of the support plate 4 is 1 cm or less. When the difference in height is 1 cm or less, no excessive force is applied to the substrate 1 or the support plate 4, and damage to or a deformation of the substrate 1 or the support plate 4 can be prevented.

Detection Unit 14

The detection unit 14 detects a force that is applied to the lifting and lowering unit 12. Accordingly, the detection unit 14 detects whether or not an excessive force is applied to the lifting and lowering unit 12, that is, whether or not an excessive force is applied to the laminate which is held by the holding units 11. As such, when an excessive force may be applied to the laminate that is held by the holding units 11, the holding units 11 release the holding of the support plate 4 or the lifting and lowering unit 12 stops the rise of the holding units 11. In this manner, the application of an excessive force to the laminate held by the holding units 11 can be suppressed, and damage to or a deformation of the substrate 1 can be appropriately prevented. Examples of the detection unit of the supporting member separation apparatus according to the invention can include those using a load cell or the like.

Also, the supporting member separation apparatus 100 may include a control unit that stops the supporting member separation processing when a result of the detection by the detection unit 14 is equal to or exceeds a pre-set threshold. Examples of the processing to stop the supporting member separation processing include the release of the holding of the laminate by the holding units 11 and the stopping of the rise of the holding units 11 by the lifting and lowering unit 12. In this manner, the control unit automatically stops the supporting member separation processing when an excessive force is applied to the laminate held by the holding units 11, and damage to or a deformation of the substrate 1 can be appropriately prevented.

The pre-set threshold is not particularly limited insofar as the threshold is a value at which damage to or a deformation of the substrate 1 does not occur. Preferably, the threshold is 2.0 Kgf to 7.0 Kgf and, more preferably, is 3.0 Kgf to 5.0 Kgf. In this manner, the support plate 4 can be separated from the laminate even when a force smaller than the threshold is applied to the laminate in a case where the release layer 3 is altered sufficiently. Further, in a case where a force approximately equal to the above-described threshold is applied to the laminate, damage to or a deformation of the substrate 1 does not occur. As such, the supporting member separation processing can be stopped before damage to or a deformation of the substrate 1 occurs.

Further, the control unit may control the supporting member separation apparatus 100 so that the separation of the support plate 4 is initiated again after the supporting member separation processing is stopped. For example, the control unit controls the supporting member separation apparatus 100 again so that the holding units 11 hold the laminate in a case where the holding of the laminate by the holding units 11 is released, or controls the supporting member separation apparatus 100 again so that the lifting and lowering unit 12 raises the holding units 11 in a case where the rise of the holding units 11 by the lifting and lowering unit 12 is stopped. In this manner, the separation of the support plate 4 can be automatically performed again by the supporting member separation apparatus 100. In a case where the separation of the support plate 4 is initiated again and the result of the detection by the detection unit 14 exceeds the pre-set threshold again, the control unit stops the supporting member separation processing.

Further, the control unit may control the supporting member separation apparatus 100 so that the supporting member separation processing is completed in a case where a force equal to or exceeding the threshold is added intermittently by three times to the same laminate. In a case where the support plate 4 cannot be separated even after the force equal to or exceeding the threshold is added intermittently by three times, the possibility of appropriately separating the support plate 4 thereafter is low even if the supporting member separation processing is repeated under the same condition. Accordingly, the control unit controls the supporting member separation apparatus 100 so that the supporting member separation processing is completed in a case where the support plate 4 cannot be separated even after reaching a previously determined number of times (three times in this embodiment), and thus repetition of unnecessary processing can be prevented. Also, the number of times by which the force equal to or exceeding the threshold is added to the same laminate until the control unit completes the supporting member separation processing is not limited to three times, but a user can determine an adequate number.

Operation Flow of Supporting Member Separation Apparatus 100

Hereinafter, an operation flow of the supporting member separation apparatus 100 according to an embodiment of the invention will be described. First, the laminate where the release layer 3 is adhered through the irradiation of light is installed on the stage 8. In this case, the laminate to which the dicing tape 5 is adhered via the porous portion 7 can be suctioned, and the laminate can be fixed on the stage 8.

Then, the holding units 11 hold the surface of the support plate 4 of the laminate on the side opposite to the surface where the release layer 3 is disposed. In this embodiment, the suction means that is connected to the holding units 11 is used to suction and hold the support plate 4 by the holding units 11.

Then, the lifting and lowering unit 12 is raised and the holding units 11 that hold the support plate 4 are raised. In this manner, the support plate 4 (one surface of the laminate) can be raised in a state where the laminate is fixed on the stage 8.

In a case where the force that is applied to the laminate when the support plate 4 is raised is less than the pre-set threshold, the support plate 4 is raised without stopping the supporting member separation processing. Accordingly, the support plate 4 can be separated from the laminate.

In a case where the force that is applied to the laminate when the support plate 4 is raised is equal to or exceeds the pre-set threshold, the supporting member separation processing is stopped. Then, the supporting member separation processing is performed again on the same laminate. Then, the supporting member separation processing is completed in a case where the force equal to or exceeding the threshold is intermittently added to the laminate by a previously determined number of times (for example, three times).

Regardless of the completion of the supporting member separation processing, the release layer 3 may be irradiated with light again from a support plate 4 side to be further altered if the support plate 4 cannot be separated from the substrate 1 in the laminate. In this manner, the separation of the support plate 4 from the laminate is further facilitated in a case where the supporting member separation processing is performed again for the same laminate.

In this embodiment, the supporting member separation apparatus 100 includes the holding units 11 that hold one surface of the laminate, and the adjustment unit 13 that maintains the force applied to the holding units 11 to be constant when the holding units 11 are lifted and lowered by the lifting and lowering unit 12. Accordingly, an equal force is applied to the entire support plate 4 held by the holding units 11, and the support plate 4 is separated from the laminate in such a manner that the part of the release layer 3 loosely adhered to the adhesive layer 2 is peeled off first from the adhesive layer 2, the part of the support plate 4 loosely adhered to the release layer 3 is peeled off first from the release layer 3, or the part of the release layer 3 more likely to be destructed is destructed first. As such, the support plate 4 can be separated from the laminate with a relatively small force and while suppressing damage to or a deformation of the substrate without causing damage to or a deformation of the substrate 1 or the support plate 4.

After the support plate 4 is separated by using the supporting member separation apparatus 100 according to this embodiment, the holding units 11 that hold the support plate 4 may transport the support plate 4 to a removing unit (not shown) which removes the release layer 3 adhered to the support plate 4 or to a release layer removal device (not shown) which removes the release layer 3.

The supporting member separation method using the supporting member separation apparatus 100 has been described in this embodiment. However, the invention is not limited thereto, but a supporting member separation method using another supporting member separation apparatus and a case where a supporting member is separated without using a supporting member separation apparatus are also included in the supporting member separation method according to the invention.

The embodiment of the invention will be described in further detail by showing the following example. It is a matter of course that the invention is not limited to the following example but various aspects are possible in details. Further, the invention is not limited to the above-described embodiment but various modifications are possible within the scope of the following aspects, and embodiments obtained through appropriate combination of respectively disclosed technical means are also included in the technical scope of the invention. Also, all of the documents in this specification are employed for reference.

EXAMPLES

Example 1

Manufacturing of Laminate

The laminate of this example is manufactured in the following manner. First, a fluorocarbon film (1 μm in thickness) that is a release layer was formed on a supporting member (12-inch glass support plate, 700 μm in thickness) by a CVD method using $C_4F_8$ as a reaction gas under the conditions of a flow rate of 400 sccm, a pressure of 700 mTorr, a high-frequency power of 2,500 W, and a film formation temperature of 240° C. Next, TZNR-A3007t (manufactured by Tokyo Ohka Kogyo Co., Ltd.) that is an adhesive composition was spin-coated on a 12-inch silicon wafer, and an adhesive layer (50 μm in film thickness) was formed through heating for three minutes each at 100° C., 160° C., and 200° C. Then, adhesion between the silicon wafer and the support plate was performed via the adhesive layer and the release layer for three minutes under the vacuum conditions of 220° C. and 4,000 Kg to manufacture the laminate.

Separation of Support Plate

The laminate that was manufactured under the above-described manufacturing conditions was subjected to the following processing, and then it was examined whether or not the support plate was separated from the silicon wafer.

Pulsed laser having a wavelength of 532 nm was applied from a support plate side of the laminate toward the release layer. The laser conditions were 19 A in current, 6,500 mm per second in irradiation rate, 40 kHz in pulse frequency, 180 μm in irradiation pitch, and φ309 mm in irradiation range.

After the pulsed laser was applied under the above-described conditions, the support plate was separated from the laminate by using the supporting member separation apparatus including the joint as the adjustment unit in the supporting member separation apparatus shown in FIGS. 1A and 1B. In the supporting member separation apparatus, four adsorption pads (φ15 mm) as the holding units are disposed (the center of the adsorption pad is positioned 2.5 mm apart from the outer circumference) in the plate portion with a radius of 150 mm at positions 10 mm apart from the outer circumference thereof, and the support plate was adsorbed by the adsorption pads at a combined adsorption force of 90 kPa. Then, the adsorption pads where the support plate is adsorbed were raised at a speed of 1 mm to 2 mm per second in a state where the laminate is fixed to the stage. In this case, the force applied to the lifting and lowering unit that raises the holding units was detected by the detection unit to be 0.3 Kgf. Then, the adsorption pads where the support plate is adsorbed were raised by 20 mm, and the support plate was separated from the laminate fixed to the stage.

Comparative Example 1

A laminate was manufactured by the same method as in Example 1, and was irradiated with laser under the same conditions.

After pulsed laser was applied under the same conditions as in Example 1, the support plate was separated from the laminate by using the supporting member separation apparatus. The adjustment unit (joint) that maintains the force applied to the holding units to be constant is not disposed in the supporting member separation apparatus that is used in this comparative example, and the holding units move only in a lifting and lowering direction. The plate portion and the adsorption pad of the supporting member separation apparatus that is used in this comparative example are the same as in Example 1.

First, the support plate was adsorbed by the adsorption pad at a combined adsorption force of 90 kPa by using the supporting member separation apparatus according to this comparative example. Then, the adsorption pad where the support plate is adsorbed was raised at a speed of 1 mm to 2 mm per second in a state where the laminate is fixed to the stage. In this case, the force applied to the lifting and lowering unit that raises the holding units was detected by the detection unit to be 3.0 Kgf, but the silicon wafer was cracked.

In Example 1, the support plate could be separated from the laminate in a state where the force applied to the lifting and lowering unit was smaller than in Comparative Example 1. In Comparative Example 1, the force applied to the lifting and lowering unit was larger than in Example 1 and, as a result, the silicon wafer was cracked when the support plate was separated from the laminate. As described above, a less force was applied to the lifting and lowering unit in a case where the supporting member separation apparatus according to Example 1 was used, and the support plate was able to be separated from the laminate in a more stable manner.

INDUSTRIAL APPLICABILITY

The supporting member separation apparatus and the supporting member separation method according to the invention can be widely used in processes for manufacturing microfabricated semiconductor devices and the like.

EXPLANATIONS OF NUMERALS OR LETTERS

1: Substrate
2: Adhesive layer
3: Release layer
4: Support plate (supporting member)
5: Dicing tape
6: Dicing frame
7: Porous portion
8: Stage
11: Holding unit
12: Lifting and Lowering unit
13: Adjustment unit
14: Detection unit
15: Plate portion
16: Stopper
100: Supporting member separation apparatus While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A supporting member separation apparatus that separates a supporting member from a laminate having a substrate, an adhesive layer, a release layer which has a property that changes when it absorbs light, and the supporting member which are laminated in this order, the supporting member separation apparatus comprising:
   a holding unit that holds one surface of the laminate;
   a lifting and lowering unit that lifts and lowers the holding unit;
   an adjustment unit that maintains a constant force which is applied to the holding unit; and
   locking means that is in contact with the adjustment unit or a plate portion including the holding units when the holding units are to be inclined.

2. The supporting member separation apparatus according to claim 1, wherein the adjustment unit includes a joint that is movable with respect to the holding unit and the joint, when movable, has an arcuate or circular trajectory which is parallel with or vertical to a surface of the laminate.

3. The supporting member separation apparatus according to claim 1, further comprising a detection unit that detects a force which is applied to the lifting and lowering unit.

4. The supporting member separation apparatus according to claim 3, further comprising a control unit that stops supporting member separation processing by releasing of the holding of the laminate by the holding unit and/or by stopping of rise of the holding unit by lifting and lowering the unit when a result of the detection by the detection unit is equal to or exceeds a pre-set threshold.

5. The supporting member separation apparatus according to claim 4, wherein the threshold is 2.0 Kgf to 7.0 Kgf.

6. The supporting member separation apparatus according to claim 1, wherein the locking means is in contact with the adjustment unit or the plate portion whereby the difference in height between the highest position of the supporting member and the lowest position of the supporting member is 1 cm or less.

7. A supporting member separation method for separating a supporting member from a laminate having a substrate, an adhesive layer, a release layer which has a property that changes when it absorbs light, and the supporting member which are laminated in this order, the method comprising:
   fixing the laminate;
   holding one surface of the laminate by a holding unit;
   lifting and lowering an adjustment unit including a joint that is movable with respect to the holding unit; and causing the adjustment unit or a plate portion including the holding unit to come into contact with a stopper when the holding unit is inclined.

8. The supporting member separation method according to claim 7, wherein the supporting member separation processing is stopped by releasing of the holding of the laminate and/or by stopping the rise of the surface, when a force that is applied to the laminate when the one surface of the laminate is raised is equal to or exceeds a pre-set threshold.

9. The supporting member separation method according to claim 8, wherein the supporting member separation processing is stopped when the force is equal to or exceeds the threshold, and then the supporting member separation processing is performed again on the same laminate.

10. A supporting member separation method for separating a supporting member from a laminate having a substrate, an adhesive layer, a release layer which has a property that changes when it absorbs light, and the supporting member which are laminated in this order, the method comprising:
   fixing the laminate;
   holding one surface of the laminate by a holding unit, and lifting and lowering an adjustment unit including a joint that is movable with respect to the holding unit;
   lifting and lowering the laminate,
   wherein the supporting member separation processing is stopped by releasing of the holding of the laminate and/or by stopping the rise of the surface, when a force that is applied to the laminate when the one surface of the laminate is raised is equal to or exceeds a pre-set threshold, and
   wherein the supporting member separation processing is completed when a force equal to or exceeding the threshold is added intermittently three times to one laminate.

\* \* \* \* \*